· US010676391B2

United States Patent
Harrison et al.

(10) Patent No.: US 10,676,391 B2
(45) Date of Patent: Jun. 9, 2020

(54) HIGH TEMPERATURE GLASS-CERAMIC MATRIX WITH EMBEDDED REINFORCEMENT FIBERS

(71) Applicant: FREE FORM FIBERS, LLC, Saratoga Springs, NY (US)

(72) Inventors: Shay L. Harrison, East Schodack, NY (US); Joseph Pegna, Saratoga Springs, NY (US); John L. Schneiter, Cohoes, NY (US); Erik G. Vaaler, Redwood City, CA (US); Marvin Keshner, Sonora, CA (US)

(73) Assignee: FREE FORM FIBERS, LLC, Saratoga Springs, NY (US)

( * ) Notice: Subject to any disclaimer, the term of this patent is extended or adjusted under 35 U.S.C. 154(b) by 0 days.

(21) Appl. No.: 16/011,698

(22) Filed: Jun. 19, 2018

(65) Prior Publication Data
US 2018/0370846 A1 Dec. 27, 2018

Related U.S. Application Data

(60) Provisional application No. 62/524,726, filed on Jun. 26, 2017.

(51) Int. Cl.
*C03C 10/00* (2006.01)
*C03C 14/00* (2006.01)
(Continued)

(52) U.S. Cl.
CPC ............ *C03C 14/002* (2013.01); *C03C 10/00* (2013.01); *C03C 10/0036* (2013.01);
(Continued)

(58) Field of Classification Search
CPC .............. C03C 14/002; C03C 10/0036; C03C 2214/20; C03C 2214/03; C03C 2214/34;
(Continued)

(56) References Cited

U.S. PATENT DOCUMENTS 3,062,683 A 11/1962 Kalleberg et al.
3,148,102 A 9/1964 Eakins et al.
(Continued)

FOREIGN PATENT DOCUMENTS

CN 103387230 A 11/2013
EP 1 209 123 A2 5/2009
(Continued)

OTHER PUBLICATIONS

Jiang et al. Fabrication of barium-strontium aluminosilicate coatings on C/SiC composites via laser cladding. Journal of Materials Science & Technology. vol. 33, Issue 2. pp. 166-171. Feb. 2017. (Year: 2017).*

(Continued)

*Primary Examiner* — Noah S Wiese
(74) *Attorney, Agent, or Firm* — Kevin P. Radigan, Esq.; Heslin Rothenberg Farley & Mesiti P.C.

(57) ABSTRACT

Composite materials are provided which include a glass-ceramic matrix composition that is lightly crystallized, a fiber reinforcement within the glass-ceramic matrix composition which remains stable at temperatures greater than 1400° C., and an interphase coating formed on the fiber reinforcement. A method of making a composite material is also provided, which includes applying heat and pressure to a shape including fiber reinforcements and glass particles. The heat and pressure lightly crystallize a matrix material formed by the heat and pressure on the glass particles, forming a thermally stable composite material.

23 Claims, 10 Drawing Sheets

(51) Int. Cl.
| | |
|---|---|
| *C23C 16/48* | (2006.01) |
| *C23C 16/32* | (2006.01) |
| *C23C 16/40* | (2006.01) |
| *C23C 16/04* | (2006.01) |
| *C23C 16/54* | (2006.01) |
| *C03C 25/52* | (2006.01) |
| *C23C 16/06* | (2006.01) |
| *C03C 25/42* | (2006.01) |
| *C03C 25/44* | (2006.01) |
| *C03B 32/02* | (2006.01) |
| *C03B 19/06* | (2006.01) |

(52) U.S. Cl.
CPC .............. *C03C 25/42* (2013.01); *C03C 25/44* (2013.01); *C03C 25/52* (2013.01); *C23C 16/047* (2013.01); *C23C 16/06* (2013.01); *C23C 16/325* (2013.01); *C23C 16/40* (2013.01); *C23C 16/483* (2013.01); *C23C 16/545* (2013.01); *C03B 19/063* (2013.01); *C03B 32/02* (2013.01); *C03C 2214/02* (2013.01); *C03C 2214/03* (2013.01); *C03C 2214/20* (2013.01); *C03C 2214/30* (2013.01); *C03C 2214/34* (2013.01)

(58) Field of Classification Search
CPC ... C03C 2214/30; C23C 16/545; C23C 16/40; C23C 16/06; C23C 16/047; C23C 16/483; C23C 16/325; C03B 19/063; C03B 32/02
See application file for complete search history.

(56) References Cited

U.S. PATENT DOCUMENTS

| | | | |
|---|---|---|---|
| 3,755,061 A | 8/1973 | Schurb | |
| 3,958,406 A | 5/1976 | Corbiere | |
| 4,076,380 A | 2/1978 | DiMarcello | |
| 4,539,248 A | 9/1985 | Brockington et al. | |
| 4,588,699 A * | 5/1986 | Brennan | C03C 10/0045 428/698 |
| 4,962,070 A | 10/1990 | Sullivan | |
| 5,096,739 A | 3/1992 | Strutt et al. | |
| 5,134,020 A | 7/1992 | Cotteret et al. | |
| 5,296,288 A | 3/1994 | Kourtides et al. | |
| 5,326,731 A * | 7/1994 | Bhola | B24D 3/16 501/87 |
| 5,342,022 A | 8/1994 | Artjushenko et al. | |
| 5,399,430 A | 3/1995 | Nordine et al. | |
| 5,705,122 A | 1/1998 | Curran | |
| 5,786,023 A | 7/1998 | Maxwell et al. | |
| 5,955,391 A | 9/1999 | Kameda et al. | |
| 6,183,714 B1 | 2/2001 | Smalley et al. | |
| 6,291,058 B1 | 9/2001 | Goujard et al. | |
| 6,322,889 B1 | 11/2001 | Lara-Curzio et al. | |
| 6,323,413 B1 | 11/2001 | Roth et al. | |
| 6,706,400 B2 | 3/2004 | Mercuri et al. | |
| 7,657,142 B2 | 2/2010 | Gasca et al. | |
| 7,666,475 B2 | 2/2010 | Morrison | |
| 9,206,508 B1 | 12/2015 | Hariharan et al. | |
| 9,217,210 B2 | 12/2015 | Velev et al. | |
| 9,896,385 B2 | 2/2018 | Harrison et al. | |
| 9,938,393 B2 | 4/2018 | Schneiter et al. | |
| 2002/0085968 A1 | 7/2002 | Smalley | |
| 2005/0048859 A1 | 3/2005 | Canahan et al. | |
| 2005/0082676 A1 | 4/2005 | Andry et al. | |
| 2005/0181192 A1 | 8/2005 | Steffier | |
| 2005/0247904 A1 | 11/2005 | Raj et al. | |
| 2005/0255033 A1 | 11/2005 | Shimoji et al. | |
| 2006/0039524 A1 | 2/2006 | Feinroth et al. | |
| 2006/0115648 A1 | 6/2006 | Chen | |
| 2007/0093587 A1 | 4/2007 | Shen et al. | |
| 2008/0143209 A1 | 6/2008 | Tan et al. | |
| 2008/0153959 A1 | 6/2008 | Charati et al. | |
| 2008/0175988 A1 | 7/2008 | Chiu et al. | |
| 2009/0064476 A1 | 3/2009 | Cross et al. | |
| 2010/0040834 A1 | 2/2010 | Dawes et al. | |
| 2010/0055352 A1 | 3/2010 | Maxwell | |
| 2011/0124483 A1 | 5/2011 | Shah et al. | |
| 2011/0170653 A1 | 7/2011 | Cabrero et al. | |
| 2011/0274906 A1 | 11/2011 | Kim et al. | |
| 2011/0286570 A1 | 11/2011 | Farmer et al. | |
| 2012/0002777 A1 | 1/2012 | Lahoda et al. | |
| 2012/0076718 A1 | 3/2012 | Liu et al. | |
| 2012/0135224 A1 | 5/2012 | Guzman de Villoria et al. | |
| 2012/0287553 A1 | 11/2012 | Ramani et al. | |
| 2012/0315467 A1 | 12/2012 | Lafdi et al. | |
| 2012/0315815 A1 | 12/2012 | Fong et al. | |
| 2013/0010915 A1 | 1/2013 | Gamier et al. | |
| 2013/0077731 A1 | 3/2013 | Sherwood et al. | |
| 2013/0093122 A1 | 4/2013 | Schultz et al. | |
| 2013/0163711 A1 | 6/2013 | Zabiego et al. | |
| 2013/0329849 A1 | 12/2013 | Mazaudier | |
| 2014/0170919 A1 | 6/2014 | Manipatruni et al. | |
| 2015/0004393 A1 * | 1/2015 | Pegna | C04B 35/76 428/311.51 |
| 2016/0347672 A1 * | 12/2016 | Harrison | D01F 8/18 |
| 2017/0213604 A1 | 7/2017 | Pegna et al. | |
| 2017/0326838 A1 | 11/2017 | Pegna et al. | |
| 2017/0331022 A1 | 11/2017 | Pegna et al. | |
| 2017/0369998 A1 | 12/2017 | Pegna et al. | |
| 2018/0087157 A1 | 3/2018 | Harrison et al. | |
| 2018/0087214 A1 | 3/2018 | Harrison et al. | |
| 2018/0148864 A1 | 5/2018 | Harrison et al. | |

FOREIGN PATENT DOCUMENTS

| | | |
|---|---|---|
| GB | 2054542 B | 1/1983 |
| JP | 61-132628 A | 6/1986 |
| JP | H 03-285877 A | 12/1991 |
| JP | H 07-252662 A | 3/1995 |
| JP | H 09-268065 A | 10/1997 |
| JP | H 10-059780 A | 3/1998 |
| JP | 2002-211980 A | 7/2002 |
| JP | 2005-231952 A | 9/2005 |
| JP | 2013-210372 A | 10/2013 |
| WO | WO 1988/001204 A1 | 2/1988 |
| WO | WO 2010/090624 A1 | 8/2010 |
| WO | WO 2012/109841 A1 | 8/2012 |
| WO | WO 2013/180764 A1 | 12/2013 |
| WO | WO 2014/143937 A1 | 9/2014 |
| WO | WO 2015/200257 A1 | 12/2015 |

OTHER PUBLICATIONS

Wallenberger, "Strong, Small Diameter, Boron Fibers by LCVD", Materials Letters, vol. 14 (1992), pp. 198-202.
Johansson et al., "Microfabrication of Three-Dimensional Boron Structures by Laser Chemical Processing", J. Appl. Phys., vol. 72 (12), Dec. 19, 1992 (8 pages).
Wallenberger, Frederick T., "Inorganic Fibres and Microfabricated Parts by Laser Assisted Chemical Vapour Deposition (LCVD): Structures and Properties*", Ceramics International, 23 (1995) (8 pages).
Maxwell et al., "Real-Time Volumetric Growth Rate Measurements and Feedback Control of Three-Dimensional Laser Chemical Vapor Deposition", Appl. Phys. A, vol. 67, No. 3, 1998 (7 pages).
Waku et al., "An Amorphous Ceramic Al32.4Er7.6O60 Fiber with Large Viscous Flow Deformation and a High-Strength Nanocrystallized Ceramic Fiber", Journal of Materials Science, vol. 36, No. 10, pp. 2435-2440 (May 15, 2001).
Wen et al., "Interfacial Microstructure and Reaction of BN-Coated Single Crystal Al2O3 Fiber Reinforced NiAl Matrix Composites", Journal of Materials Science, vol. 37, No. 6, Mar. 1, 2002 (pp. 1253-1258).
Kerans, "High Temperature Composites", Air Force Research Laboratory Report No. AFRL-ML-WL-TP-2002-407, Aug. 2002 (22 pages).
Kerans et al., "Interface Design for Oxidation-Resistant Ceramic Composites", Journal of the American Ceramic Society, vol. 85, No. 11, pp. 2599-2632 (Nov. 1, 2002).

(56) References Cited

OTHER PUBLICATIONS

Behlau et al., "Mechanical Properties of Carbon and BN coated SiC Fibers", Ceramic Engineering and Science Proceedings, vol. 24, No. 4, Jan. 1, 2003 (pp. 225-230).
Chen et al., "Carbide Derived Carbon (CDC) Coatings for Tyranno ZMI SiC Fibers", Ceramic Engineering and Science Proceedings, vol. 24, No. 3, Jan. 26, 2003 (pp. 57-62).
Chen et al., "Carbothermal Synthesis of Al—O—N Coatings Increasing Strength of SiC Fibers", International Journal of Applied Ceramic Technology, vol. 1, No. 1, Jan. 1, 2004 (pp. 68-75).
Lee et al., "Microstructure and Mechanical Properties of Al2O3/Y3Al5O12/ZrO2 Ternary Eutectic Materials", Journal of European Ceramic Society, vol. 25, No. 8, pp. 1411-1417 (Jan. 1, 2005).
Maxwell et al., "Preparation of Superhard BxCy Fibers by Microvortex-Flow Hyperbaric Laser Chemical Deposition", Diamon & Related Materials, vol. 16, Jan. 2007 (1557-1564).
Longtin et al., "Systhesis of Carbon Nanofiber Films and Nanofiber Composite Coatings by Laser-Assisted Catalytic Chemical Vapor Deposition", Thin Solid Films, vol. 515 (2007) pp. 2958-2964.
Longtin et al., "Selective Area Synthesis of Aligned Carbon Nanofibers by Laser-Assisted Catalytic Chemical Vapor Deposition", Diamond and Related Materials, vol. 16 (2007) pp. 1541-1549.
Liao et al., "Large-Scale Aligned Silicon Carbonitride Nanotube Arrays: Synthesis, Characterization, and Field Emission Property", Journal of Applied Physics, vol. 101, No. 11, pp. 114306.1-114306.4 (Jun. 7, 2007).
Hu et al., "Oxidation Behavior of Zirconium Diboride-Silicon Carbide at 1800° C.", Scripta Materialia, vol. 57, No. 9, Nov. 2007 (pp. 825-828).
Marsh, "Quantum Well Intermixing Revolutionizes High Power Laser Diodes", Diodenlaser, LTJ No. 5, 4:32-35, doi:10.1002/latj.200790190 (Nov. 2007) (4 pages).
Liu et al., "Monolithic Integration of Sampled Grating CBR with Electroabsorption Modulator by Combining Selective-Area-Growth MOCVD and Quantum-Well Intermixing", Chinese Physics Letters, vol. 25, No. 10, Oct. 1, 2008 (pp. 3670-3672).
Jouanny et al., "Study of TiC Coatings on Nicalon Fibre Prepared by Pressure-Pulsed Reactive Chemical Vapour Deposition at Low Pressure", ECS Translations, vol. 25, No. 8, Jan. 1, 2009 (pp. 1267-1272).
Roy et al., "Atomic Layer Deposition of Alumina Onto Carbon Fibers", Journal of the American Ceramic Society, vol. 94, No. 7, pp. 2014-2022 (Jul. 1, 2011).
Zhang et al., "Ferromagnetism Induced by Intrinsic Defects and Boron Substitution in Single-Wall SiC Nanotubes", Journal of Physical Chemistry, vol. 115, No. 35, pp. 9987-9992 (Sep. 8, 2011).
Gan, Structural assessment of nanocomposites, Micron 43 (2012) pp. 782-817.
Ares et al. Columnar-to-Equiaxed Transition in Metal_matrix Composites Reinforced with Silicon Cabide Particles, Hindawi Publishing Corporation, Journal of Metallurgy, vol. 2013, Article ID 628495, 12 pages.
Glazoff et al., "Morphological Analysis of Zirconium Nuclear Fuel Rods Braided with SiC: Qality Assurance and Defect Identification", Journal of Nuclear Materials, 451.1 (Apr. 12, 2014) (pp. 216-224).
Wang et al., "UV Laser-Assisted Diamond Deposition", Nov. 2014 (100 pages), http://digitalcommons.uni.edu/cgi/viewcontent.cgi?article=1068&context=elecengtheses.
Luo et al. Microstructure, tensile strength and thermostability of W-core SiC fibers with or without carbonb coating, Materials Science & Engineering A 647 (2015) pp. 265-276.
Wang et al., "Synthesis of ZrC—SiC Powders from Hybrid Liquid Precursors with Improved Oxidation Resistance", Journal of the American Ceramic Society, vol. 98, No. 1, Jan. 2015 (pp. 197-204).
Pegna et al., Communication and Extended European Search Report (EESR) for EP Application No. 13796908.5, dated Feb. 9, 2016 (20 pages).
Jiang et al., "Fabrication of Barium-Strontium Aluminosilicate Coatings on C/SiC Composites via Laser Cladding", Journal of Materials Science & Technology, vol. 33, No. 2, Dec. 23, 2016 (pp. 167-168, 171).
Zimmerman et al. Fragmentation-driven grain refinement in directional solidification of AiCu10wit-%alloy at low pulling speeds, Acta Materialia 126 (2017) pp. 236-250.
Pegna et al., "Functional High-Performance Fiber Structure", U.S. Appl. No. 16/019,839, filed Jun. 27, 2018 (64 pages).
Pegna et al., "High Strength Ceramic Fibers and Methods of Fabrication", U.S. Appl. No. 16/101,730, filed Aug. 13, 2018 (47 pages).

* cited by examiner

HIGH TEMPERATURE GLASS-CERAMIC MATRIX WITH EMBEDDED REINFORCEMENT FIBERS

CROSS-REFERENCE TO RELATED APPLICATION

This application claims the benefit of U.S. provisional patent application Ser. No. 62/524,726, filed Jun. 26, 2017, entitled "High Performance Fibers Embedded in a High Temperature Glass-Ceramic Matrix", which is hereby incorporated herein by reference in its entirety.

BACKGROUND

The present invention relates generally to the field of fibers for reinforcing materials and more specifically to the field of fibers embedded in a high temperature glass-ceramic matrix.

In a wide variety of applications, fiber composite materials, incorporating fibers into a surrounding material matrix, provide higher structural performance than traditional, bulk (i.e., non-fiber-reinforced) materials. Such materials have been used in aerospace applications including turbo machinery, rockets, and advanced structures, automobile applications, biomedical applications, and the energy industry. Therefore, opportunities exist for fiber composite materials with increased strength, stiffness, and heat/chemical resistance.

SUMMARY

In one aspect of the present invention, a composite material is provided, including a glass-ceramic matrix composition which is lightly crystallized, a fiber reinforcement within the glass-ceramic matrix composition, the fiber reinforcement remaining stable at a temperature greater than 1400° C., and an interphase coating formed on the fiber reinforcement.

In another aspect of the present invention, disclosed is a composite material including a glass-ceramic matrix composition stable at operating temperatures greater than 1400° C., the glass-ceramic matrix being lightly crystallized to enhance overall creep resistance of the composite material, a fiber reinforcement that that remains stable at operating temperatures greater than 1400° C. within the glass-ceramic matrix composition, and an interphase coating formed on the fiber reinforcement.

In another aspect of the present invention, disclosed is a method including the steps of obtaining a plurality of fiber reinforcements, a fiber reinforcement of the plurality of fiber reinforcements being stable at an operating temperature greater than 1400° C. and an interphase coating formed thereon, assembling the plurality of fiber reinforcements into a press, surrounding the plurality of fiber reinforcements with glass particles; and applying heat and pressure to the plurality of fiber reinforcements surrounded by glass particles in the press under one of a vacuum or an inert atmosphere, melting the glass particles and forming a glass-ceramic matrix composition surrounding the plurality of high-performance fiber reinforcements, the glass-ceramic matrix composition being lightly crystalized to enhance overall creep resistance of the composite material.

Additional features and advantages are realized through the techniques of the present invention. Other embodiments and aspects of the invention are described in detail herein and are considered a part of the claimed invention.

BRIEF DESCRIPTION OF THE DRAWINGS

These and other features, aspects, and advantages of the present invention will become better understood when the following detailed description is read with reference to the accompanying drawings in which like characters represent like parts throughout the drawings, and wherein.

DETAILED DESCRIPTION

Figure 1:
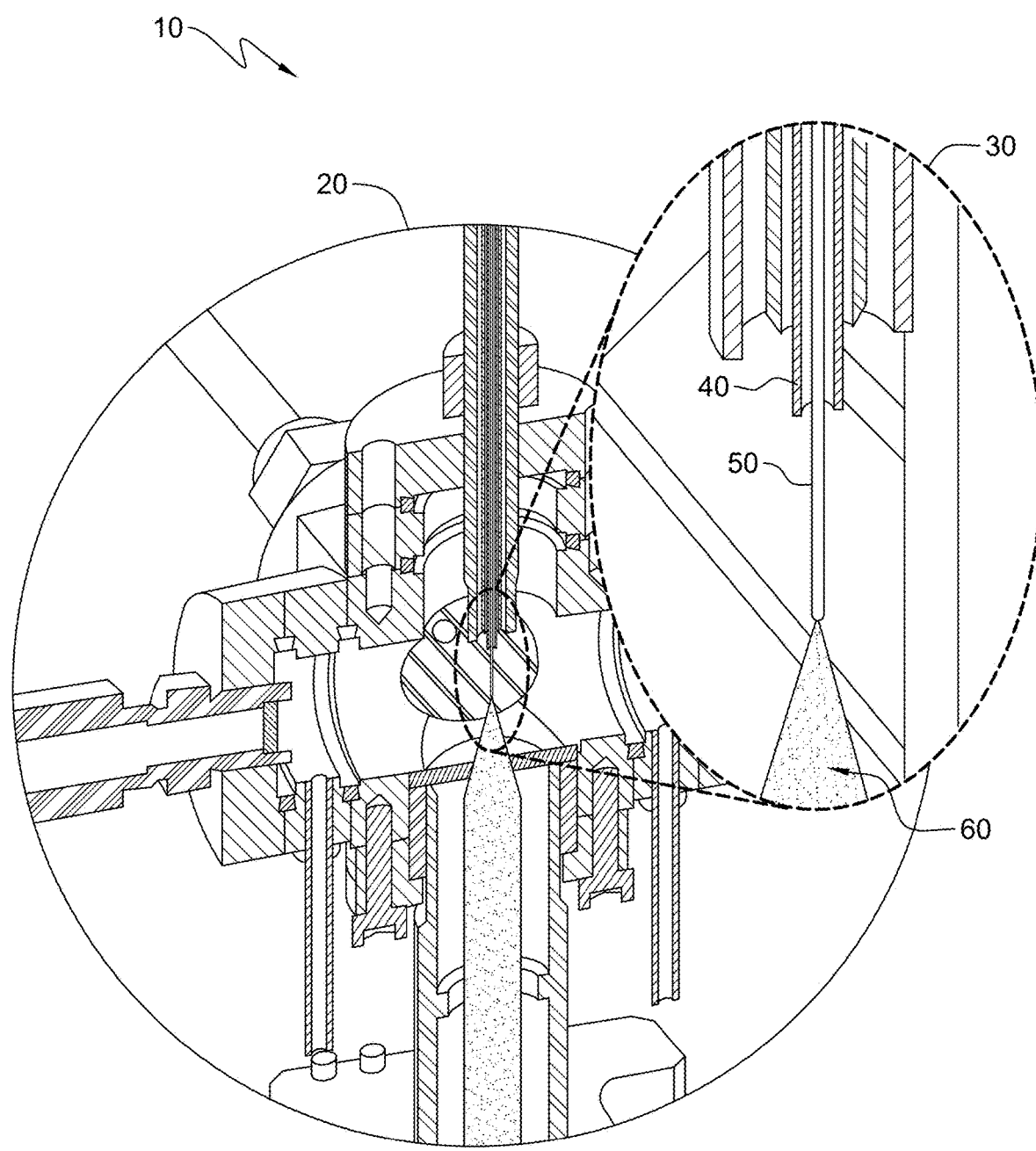
FIG. 1 is a schematic representation of a single-fiber reactor, showing a seed fiber substrate, a reactor cube into which precursor gases are delivered, a focused laser beam impinging on the seed fiber, and reactor windows that are transparent to the incoming laser beam wavelength and allow for, for instance, video monitoring of the process, in accordance with one or more aspects of the present invention.

Aspects of the present invention and certain features, advantages and details thereof, are explained more fully below with reference to the non-limiting example(s) illustrated in the accompanying drawings. Descriptions of well-known systems, devices, fabrication and processing techniques, etc., are omitted so as to not unnecessarily obscure the invention in detail. It should be understood, however, that the detailed description and the specific example(s), while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure. Note further that numerous inventive aspects and features are disclosed herein, and unless inconsistent, each disclosed aspect or feature is combinable with any other disclosed aspect or feature as desired for a particular application, for instance, for facilitating providing composite materials having a glass-ceramic matrix with fiber reinforcements, as described herein.

Note that the inventive aspects disclosed herein may be used alone or in combination with one or more of the aspects or techniques described in U.S. Pat. No. 9,896,385 B2, issued Feb. 20, 2018, and entitled "Contiguously Blended Nano-Scaled Multi-Phase Fibers", U.S. Pat. No. 9,938,393 B2, issued Apr. 10, 2018, and entitled "Radially Graded Fully Dense Inorganic Filaments for Enhanced Strength and Creep Resistance", U.S. Patent Publication No. 2018/0087157 A1, which published on Mar. 29, 2018, entitled "Multi-Composition Fiber with Refractory Additive(s) and Method of Making", and U.S. Patent Publication No. 2018/0087214 A1, which published on Mar. 29, 2018, entitled "Refractory Oxide Coated Fiber and Method of Making", each of which is hereby incorporated herein by reference in its entirety.

Additionally, one or more aspects of the present invention may relate to one or more of the aspects described in U.S. Patent Publication No. 2018/0004393 A1, which published on Jan. 1, 2015, entitled "High Strength Ceramic Fibers and Methods of Making", U.S. Patent Publication No. 2017/0213604 A1, which published Jul. 27, 2017, entitled "An Additive Manufacturing Technology for the Fabrication and Characterization of Nuclear Reactor Fuel", U.S. Patent Publication No. 2017/0331022 A1, which published Nov. 16, 2017, entitled "Multilayer Functional Fiber and Method of Making", U.S. Patent Publication No. 2017/0326838 A1, which published Nov. 16, 2017, entitled "Fiber Delivery Assembly and Method of Making", U.S. Patent Publication No. 2017/0369998 A1, which published Dec. 28, 2017, entitled "Nanofiber-Coated Fiber and Methods of Making", and U.S. Patent Publication No. 2018/0148864 A1, which published May 31, 2018, entitled "Fiber with Elemental Additive(s) and Method of Making", each of which is also hereby incorporated herein by reference in its entirety.

For instance, the above-noted U.S. Pat. No. 9,938,393 B2 describes a fiber microstructure created by an LCVD process, such as described in one or more of the above incorporated applications, and applies to the fiber compositions noted herein, especially in the specific material system example with the SiC fiber.

Further, U.S. Patent Publication No. 2018/0087157 A1 is applicable to the various materials cited herein for potential fiber compositions, specifically, combinations of different fiber chemistries, such as, combining a carbide with another carbide, a carbide with a boride, etc., to go into the glass-ceramic matrix composite material disclosed herein. In addition, U.S. Pat. No. 9,896,385 B2 discloses further details of fiber chemistries and fiber morphology for fiber compositions cited herein as potential components to the glass-ceramic matrix composite.

Disclosed herein, in one or more aspects, is a composite material comprising a glass-ceramic matrix composition that is functional at high operating temperatures (such as greater than 1400° C., and in some aspects, greater than 1550° C.), that undergoes a crystallization step that converts the glass into a lightly crystallized (i.e., small grain sized crystals) material during a fabrication process, in order to enhance the overall creep resistance of the composite material. As used herein, the term lightly crystallized refers to material of the crystalline matrix which is not amorphous, but rather possesses a small average grain size; in some embodiments less than 10 nanometers in length, which is dispersed periodically throughout the class-ceramic matrix composition. In some embodiments, the glass-ceramic matrix is partially crystallized, with some percentage of residual amorphous material still remaining in the glass-ceramic matrix composition, and in some embodiments, the glass-ceramic matrix is fully crystallized.

In addition, the composite material includes a high-performance fiber reinforcement that has similar elevated operating temperature capability, produced in some aspects from laser chemical vapor deposition, and an interphase coating that may be formed on the fiber reinforcement to enhance the overall composite material toughness, or strength in terms of rigidity. Lightly crystallized matrices, as compared to amorphous glass matrices, are less prone to creep. For instance, the processing used to achieve light crystallization in the glass-ceramic matrix can involve controlled time-at-temperature exposure in a furnace, with varying glass composition-specific time and temperature parameters to foster crystallite nucleation and small grain growth, while also preventing softening of the glass. For instance, the light crystallization of barium magnesium aluminosilicate is done below 1250° C. for a period of 12 to 48 hours. Thus, the fiber reinforcements should be capable of remaining stable at these elevated temperatures.

The fiber reinforcement may be produced, in some aspects, using laser chemical vapor deposition (LCVD) in order to increase the temperature at which the fiber is stable, as compared to previous fibers. In some aspects, a conventional fiber may be treated to remove impurities and increase the resistance to heat, as will be described below. The term high-performance, in reference to the fiber reinforcements, refers to the ability of the fiber to withstand and remain chemically stable at high operating temperatures, including temperatures of at least 1400° C., and in some embodiments, temperatures of 1550° C. or above, while maintaining appreciable percentage of the room temperature tensile strength. In addition, high-performance describes the maintenance of these thermal, chemical, and mechanical properties at high operating temperatures for long time periods, on the order of thousands of hours. The fiber reinforcements according to embodiments of the present invention being stable at higher temperatures, are capable of being incorporated into glass-ceramic matrices, which require high-temperature processing.

Fiber-reinforced composite materials are designed to concomitantly maximize strength and minimize weight. This is achieved by embedding high-strength low-density fibers into a low-density filler matrix in such a way that fibers channel and carry the structural stresses in composite material structures. The matrix serves as a glue that holds fibers together and helps transfer loads in shear from fiber to fiber, but in fact the matrix material is not a structural element and carries but a fraction of the overall structural load seen by a composite material.

Composite materials are thus engineered materials made up of a network of reinforcing fibers—sometimes woven, knitted or braided—held together by a matrix. Fibers are usually packaged as twisted multifilament yarns called "tows". The matrix gives rise to three self-explanatory classes of composite materials: (1) Polymer Matrix Composites (PMCs), sometimes-called Organic Matrix Composites (OMCs); (2) Metal Matrix Composites (MMC's); and (3) Ceramic Matrix Composites (CMCs).

Such an approach to composite materials in which the tows are but a disorganized bundle of entangled filaments constrains the fibers to a purely structural role. A new approach to the fabrication of multilayered fibers called 1½-D printing allows for the formation of evenly spaced, parallel filaments. Together, this construct constitutes an arbitrary long ribbon of continuous filaments that allow the fiber to break out of their purely structural functions, and enable sweeping new designs in which the fibers contain embedded microsystems. This is described further in the above-referenced, commonly assigned, U.S. Patent Publication No. 2017/0326838 A1.

This approach to fiber manufacturing has been proposed for example as a means to produce TRISO-inspired nuclear fuel embedded within fibers for subsequent embedding into a refractory matrix to form an accident tolerant CMC nuclear fuel, such as described in the above-referenced, commonly assigned PCT Patent Publication No. WO 2015/200257 A1. However, this is but one instance of possible new designs enabled by this technology.

At its core, 1½-D printing rests on the physical principles of Laser Induced Chemical Vapor Deposition to both print continuous filaments and deposit patterns coated onto the fiber. Commonly assigned, U.S. Patent Publication No. 2015/0004393 A1, teaches how arrays of filaments can be laser-printed, with diameters potentially varying along their length. The above-referenced, PCT Patent Publication No. WO 2015/200257 A1 teaches how a laser incident to the ribbon can be used to write a pattern of coatings onto a substrate fiber by turning the laser on or off as the ribbon advances. It also teaches that coating thickness can be adjusted. Finally, the above-referenced, commonly assigned U.S. Patent Publication No. 2017/0326838 A1, teaches how such ribbons of parallel filaments can be collected as ribbons onto a tape to enhance fiber volume fraction in the composite.

To implement 1½-D printing, Laser Induced Chemical Vapor Deposition (LCVD) was chosen as the fundamental Additive Manufacturing (AM) tool for its near material independence—an extremely rare property for AM processes. Such a process is said to be "Material Agnostic". LCVD is a technique derived from CVD, used intensively in the microelectronics fabrication industry (aka "Chip Fab"). CVD builds up electronics-grade high-purity solid deposits from a gas precursor. In its 75+ year history, Chip Fab has accumulated an impressive library of chemical precursors for a wide range of materials, numbering in the 10's of thousands. The main difference between CVD and LCVD resides in dimensionality and mass throughput. CVD is intended for 2-D film growth whereas LCVD is ideally suited for one-dimensional filamentary structures. The dimensionality difference means that deposition mechanisms are greatly enhanced for LCVD vs. CVD, leading to deposited mass fluxes (kg/m2 s) that are 3 to 9 orders of magnitude greater. For example, diamond-like carbon filaments have been measured at linear growth rates upwards of 13 cm/s, which represents a 9 order of magnitude increase in mass flux compared to thin film CVD of the same material. Finally, LCVD is essentially containerless, which virtually eliminates opportunities for material contamination by container or tool.

The following fundamental properties formally defines "1½-D Printing" AM

Material-agnostic ability to grow filaments.

Figure 10:
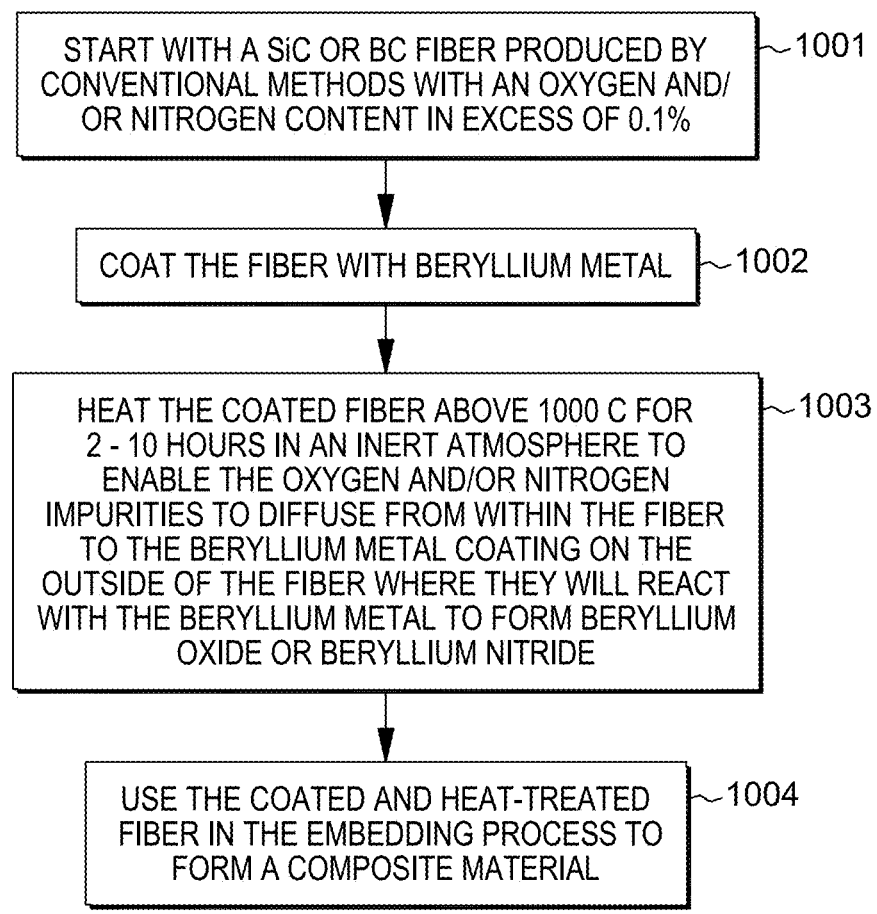
FIG. 10 depicts one embodiment of a method of preparing a fiber for forming a composite material, in accordance with one or more aspects of the present invention.

Ability to vary diameter along the length of the filament, as illustrated in FIG. 10 of Pegna et al. (PCT Publication No. WO 2015/200257 A1).

Material-agnostic ability to vary composition along the length of the filament, as was demonstrated by Maxwell et al.

Material-agnostic ability to coat specific sections of filaments with a desired material, morphology and thickness; as illustrated by the nanoporous and other spot coatings shown in FIG. 11 of the above-referenced Pegna et al., PCT publication.

Disclosed herein, in part, is the concept of avoiding the use of polymeric precursors altogether by using laser-assisted chemical vapor deposition (LCVD) as is described in U.S. Pat. No. 5,786,023, entitled "Method and Apparatus for the Freeform Growth of Three-Dimensional Structures Using Pressurized Precursor Flows and Growth Rate Control", by Maxwell and Pegna, the entirety of which is hereby incorporated by reference herein. In this process pure precursor gases (such as silane and ethylene in the case of SiC fiber production) are introduced into a reactor within which a suitable substrate such as glassy carbon is positioned, and laser light is focused onto the substrate. The heat generated by the focused laser beam breaks down the precursor gases locally, and the atomic species deposit onto the substrate surface and build up locally to form a fiber. If either the laser or the substrate is pulled away from this growth zone at the growth rate a continuous fiber filament will be produced with the very high purity of the starting gases. With this technique there are virtually no unwanted impurities, and in particular no performance-robbing oxygen.

Very pure fibers can be produced using LCVD, such as silicon carbide, boron carbide, silicon nitride and others. The inventors have discovered that if a material has been deposited using CVD, there is a good chance that fiber can be produced using LCVD. Unlike with liquid polymeric precursors, however, where the chemistry can be very involved and complicated even for relatively 'simple' materials such as those mentioned above, LCVD can also be used quite directly to produce novel mixes of solid phases of different materials that either cannot be made or have not been attempted using polymeric precursor and spinneret technology. Examples include fibers composed of silicon, carbon and nitrogen contributed by the precursor gases such as silane, ethylene and ammonia, respectively, where the resulting "composite" fiber contains tightly integrated phases of silicon carbide, silicon nitride and silicon carbonitrides depending on the relative concentrations of precursor gases in the reactor. Such new and unique fibers can exhibit very useful properties such as high temperature resistance, high strength, and good creep resistance at low relative cost, which can be more compatible with a glass-ceramic matrix composition.

FIG. 1 shows a LCVD reactor into which a substrate seed fiber has been introduced, onto the tip of which a laser beam is focused. (It will be seen that the substrate may be any solid surface capable of being heated by the laser beam. It will further be seen that multiple lasers could be used simultaneously to produce multiple simultaneous fibers as is taught in International Patent Application Serial No. PCT/US2013/022053, which published on Dec. 5, 2013, as PCT Patent Publication No. WO 2013/180764 A1, and in U.S. Patent Publication No. 2015/0004393, the entireties of which are hereby incorporated by reference herein. In accordance with that Application, FIG. 1 more particularly shows a reactor 10; enlarged cutout view of reactor chamber 20; enlarged view of growth region 30. A self-seeded fiber 50 grows towards an oncoming coaxial laser 60 and is extracted through an extrusion microtube 40.

A mixture of precursor gases can be introduced at a desired relative partial pressure ratio and total pressure. The laser is turned on, generating a hot spot on the substrate, causing local precursor breakdown and local CVD growth in the direction of the temperature gradient, typically along the axis of the laser beam. Material will deposit and a fiber will grow, and if the fiber is withdrawn at the growth rate, the hot spot will remain largely stationary and the process can continue indefinitely, resulting in an arbitrarily long CVD-produced fiber.

Figure 2:
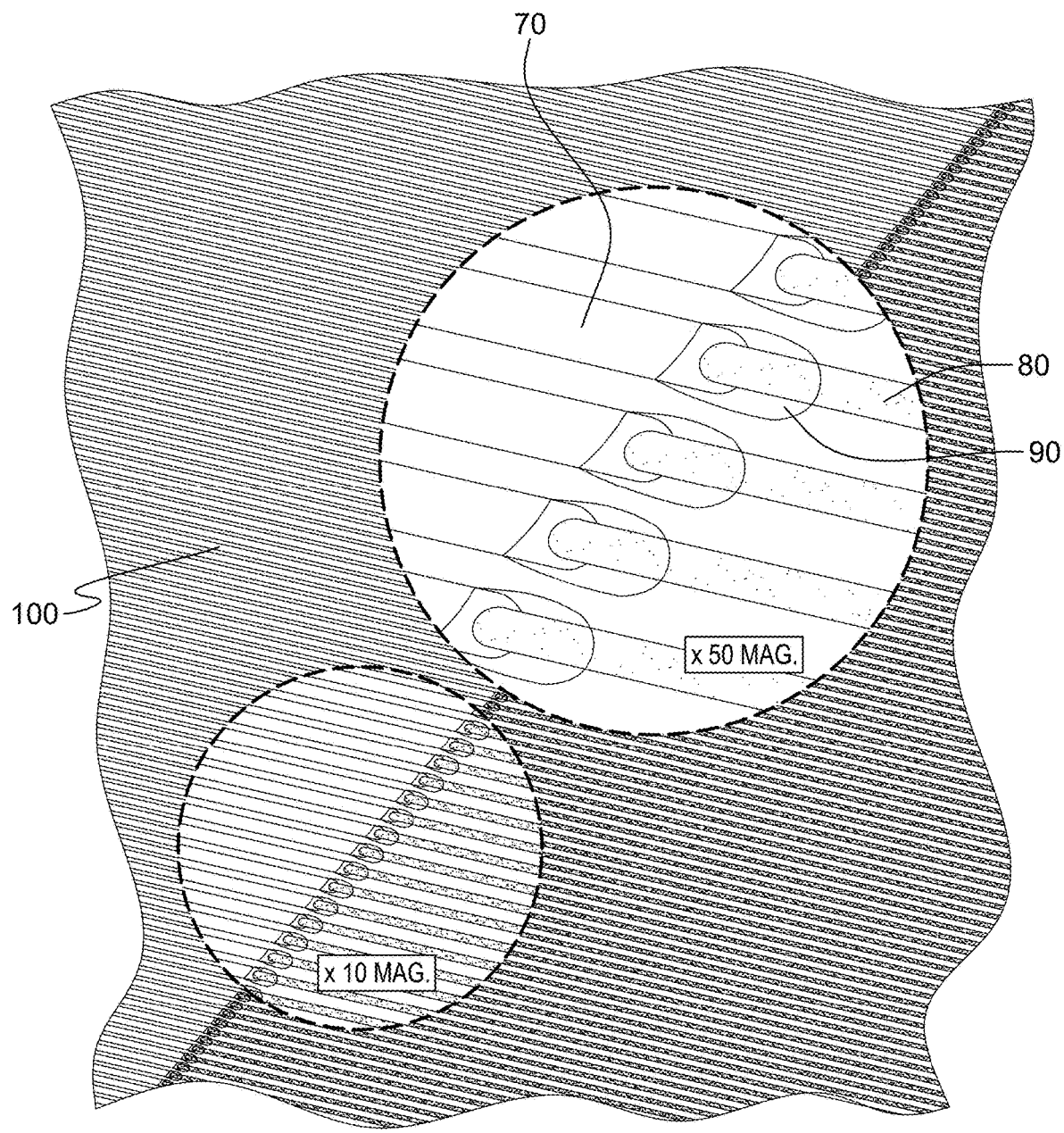
FIG. 2 is a schematic view showing how laser chemical vapor deposition (LCVD) can be massively parallelized by a multiplication of the laser beams, in accordance with one or more aspects of the present invention.
Figure 3:
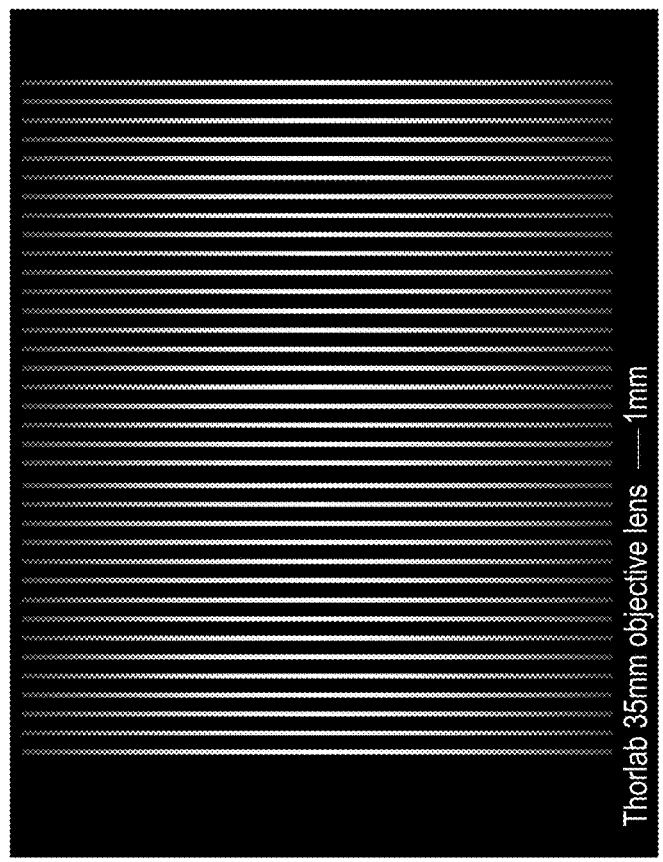
FIG. 3 depicts an example of parallel LCVD growth of carbon fibers, in accordance with one or more aspects of the present invention.
Figure 3:
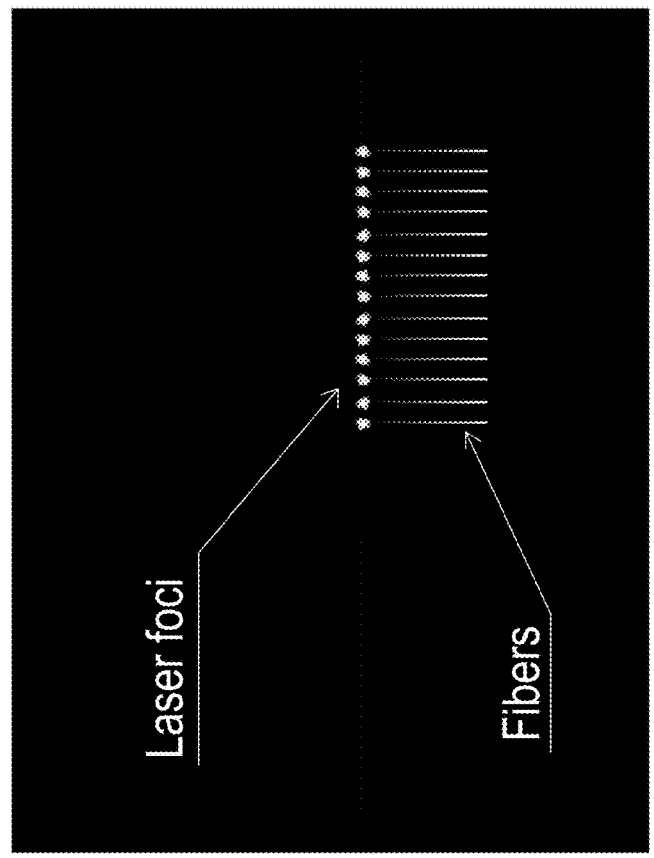

Also in accordance with that Application, a large array of independently controlled lasers can be provided, growing an equally large array of fibers 70 in parallel, as illustrated in FIG. 2, showing how fiber LCVD can be massively parallelized from a filament lattice 100 by multiplication of the laser beams 80 inducing a plasma 90 around the tip of each fiber 70. Using a Computer to Plate (CtP) (e.g., Quantum Well Intermixing (QWI)) laser array for LCVD is a scientific first, and so was the use of a shallow depth of focus. It provides very beneficial results. Sample carbon fibers, such as those shown in FIG. 3, were grown in parallel. FIG. 3 shows parallel LCVD growth of carbon fibers—Left: Fibers during growth and Right: Resulting free standing fibers 10-12 µm in diameter and about 5 mm long.

Figure 4A:
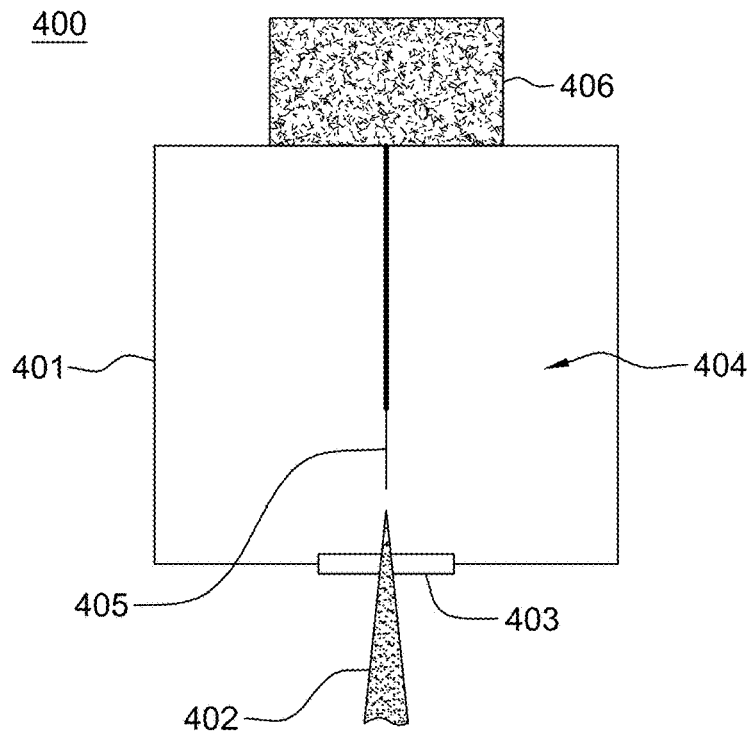
FIG. 4A is a simplified schematic of components of an LCVD system facilitating fabrication of a multi-composition fiber with elemental additive(s), in accordance with one or more aspects of the present invention.

As discussed herein, laser-driven, chemical-vapor deposition (LCVD) technology is capable of forming high-performance ceramic and inorganic fibers for composite materials. FIG. 1 discussed above is a schematic representation of a monofilament LCVD production process. FIG. 4A is a simplified view of an LCVD production system for producing a multi-composition fiber with one or more elemental additives, in accordance with one or more aspects of the present invention, and FIG. 4B depicts an exemplary process for producing a multi-composition fiber with one or more elemental additives, in accordance with one or more aspects of the present invention.

Referring to FIG. 4A, the LCVD system 400 shown includes a chamber 401 into which one or more lasers 402 are directed through one or more windows 403. Chamber 401 includes precursor gases 404 for facilitating producing a fiber 405 such as disclosed herein. A fiber extraction apparatus 406 facilitates withdrawing the fiber as it is produced within the chamber.

Figure 4B:
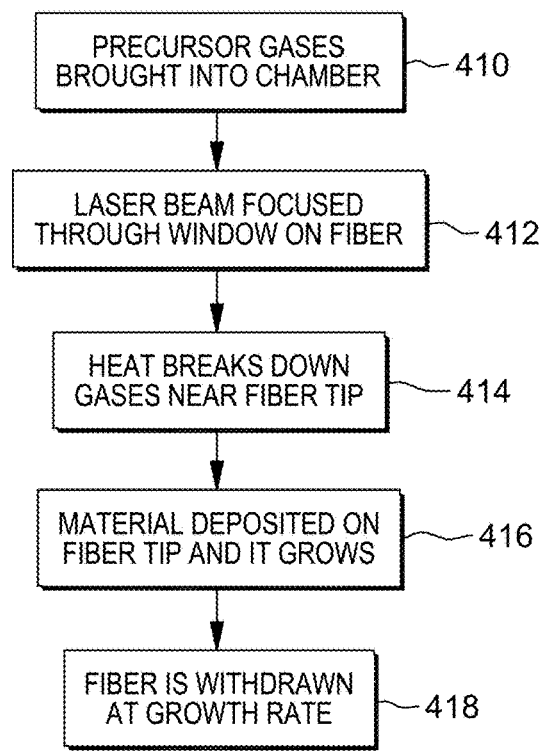
FIG. 4B depicts one embodiment of a process for fabricating a multi-composition fiber with elemental additive(s), in accordance with one or more aspects of the present invention.

The deposition process may include bringing precursor gases into the chamber 410, as illustrated in FIG. 4B. For a given fabrication process, ratios of the precursor gases are selected and introduced into the chamber. The gases contain the atomic species that are to be deposited in the fiber format. For instance, silicon carbide fibers (SiC) may be formed from silicon-containing and carbon-containing gases, or a single gas that contains both atoms. In addition, a small laser beam is directed into the gas-containing chamber through a window that transmits the laser wavelength 412. This laser beam is focused onto an initiation site, which can be a fiber seed, a thin substrate, or any other solid component that will heat up upon being intersected by the beam and absorb its energy. At this hot spot 414, the precursor gases disassociate and, through certain chemical reaction steps, deposit a desired solid product. For instance, in the example above, the solid SiC deposit accreting together form the fiber 416. The fiber itself grows towards the laser source, and thus the fiber is pulled away and out of the reactor at an equivalent fiber growth rate 418. In this manner, the deposition zone remains at a constant physical position (the focal point of the laser beam), and deposition can continue indefinitely, as long as the laser beam is on and the supply of precursor gases is replenished.

As noted above, FIG. 2 provides a representation of a massive parallelization of the laser beam input, increased from a single beam to a multitude of individually controlled laser beams, to produce high-quality volume array of parallel fibers.

By control of the localized chemistry formed in LCVD-produced fibers, multiple materials may be deposited simultaneously and homogeneously throughout the fiber microstructure. This approach can produce an inorganic, multiple material composite fiber by the LCVD process, which is composed of several desired chemistries. The localized chemistry is driven through controlled composition of the gas precursor feed. The addition of elemental atoms to the grain boundaries between the formed crystallites may require the gas precursor for that desired element to be less than approximately 5% atomic of the overall input gas composition.

Figure 5:
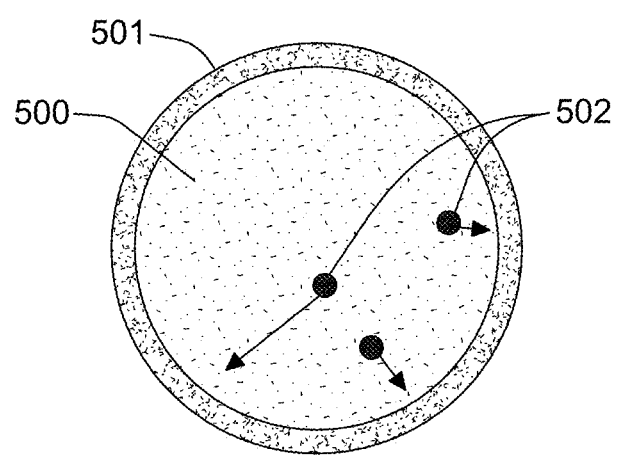
FIG. 5 depicts a partial cross-sectional view of an embodiment of a fiber with impurities being removed using a process, in accordance with one or more aspects of the present invention.

In an alternative aspect, depicted in FIG. 5, a conventionally produced fiber 500 can be treated to increase the heat resistance of the fiber. For instance, fibers, in some aspects SiC fibers, which have been produced using more conventional processes which naturally incorporate oxygen in concentrations exceeding 0.1% are treated. These fibers may be coated with a metal 501, such as beryllium, and heated to a temperature above 1000° C. for between 2 and 10 hours in an inert atmosphere. The heat treatment may allow the oxygen 502, or other impurities, to diffuse out of the core fiber 500 and to the beryllium metal 501. In some aspects, the oxygen 502 may combine with the metal 501 to form beryllium oxide. This oxide layer can operate functionally to protect the fiber 500, forming the above mentioned and below described interphase coating.

An interphase material can include a sliver of material located at the interface between a fiber and the surrounding matrix, referred to as an "interphase". In its simplest form, the interphase can be, e.g., a thin coating of either Pyrolytic Carbon (PyC), hexagonal Boron Nitride (hBN), boron nitride, carbon, and beryllium oxide. These materials are isoelectronic and exhibit similar crystalline structures. More elaborate versions of the interphase can be made of alternating layers of the interphase coating and SiC. In one or more embodiments, the interphase coating is formed using an LCVD process, similar to the process disclosed above regarding the fiber reinforcements, either at the time of forming the fiber reinforcement, or in a later processing step.

The interphase coating may represent only a fraction of 1% of the weight of a composite material, yet it can endow the composite material with nearly all of its structural toughness, or rigidity. Under conditions to be discussed here, the interphase coating may account for as a much as a quadrupling of the ultimate tensile stress and a fifty-fold increase of the strain to failure of the composite material.

An interphase coating's microscopic workings can have a large macroscopic effect. E.g., without interphase, a composite material may experience the same catastrophic failure that a monolithic ceramic does. As soon as a crack develops it can propagate through matrix and fiber alike leaving a smooth fracture surface.

A well-designed interphase coating, may provide a strain energy release mechanism that bifurcates matrix microcracks ("µcracks") into the interphase coating. A tensile µcrack developed in the matrix can be arrested at the interphase coating. An interphase coating can provide a means to diffuse strain energy that increases the tensile strength by a factor of 2-3 and increases the strain to rupture fifty-fold over monolithic ceramics.

An interphase coating can also create a strong adhesion between the innermost interphase coating layer and the fiber, which increases the toughness of the composite material. As μcracks propagate in the interphase coating, they relieve the original stress concentration in the matrix and redistribute it along the fiber until a new matrix μcrack develops and the cycle starts anew. This behavior drastically transforms the ceramic failure pattern, creating a huge population of new matrix μcracks distributed along the fiber's path while preserving the fiber's structural integrity. This modified failure mode represents a higher energy absorption mode, hence the gain in tensile strength. This desirable reaction can be generally referred to as "high density microcracking."

In one or more embodiments, the surface of the fiber reinforcement, which contains less than 0.1% oxygen and 0.1% nitrogen impurities, as conventionally produced and treated or prepared as described above, is coated with silicon carbide. The silicon carbide and any formed silicon oxide thin film create a barrier layer that protects the fiber within from oxidation at high temperatures from water vapor, oxygen or nitrogen present in the environment around the fiber. An uncoated fiber reinforcement may be coated with a barrier layer to protect the material of the fiber from reacting with oxygen, nitrogen or water vapor in the environment outside the fiber, creating the interphase coating. The interphase coating can be chosen to reduce creep in the matrix and strengthen the fiber.

In another embodiment, instead of silicon carbide, the fiber can be coated with Be, BeO, ZrO2, TiO2, or other metal oxides with heats of formation that are twice the heat of formation for carbon monoxide (CO) per mole of oxygen. Such a layer will also act as a barrier layer, or interphase coating, to prevent oxygen, water vapor, or nitrogen from the environment from entering the fiber at temperatures above 800° C. and attacking the fiber, in some aspects, SiC.

In another embodiment, the interphase coating, according to embodiments of the present invention, may include more than one layer. In some aspects, for instance, the fibers are first coated with carbon or boron-nitride (BN) and then with a second layer comprised of SiC, Be, BeO, ZrO2, TiO2, or another metal oxide. These materials have a heat of formation that is more than twice the heat of formation per mole of oxygen atoms for carbon monoxide (CO). The first layer allows for some slippage of the fibers relative to the matrix material in which they are embedded, by allowing for slippage between the first and second layers, with the second layer bonding strongly to the matrix material. The second layer protects the fibers and the first layer from degradation from oxygen, nitrogen, or water vapor in the environment at high temperatures. Protecting the fibers from attack by oxygen, water vapor, or nitrogen at high temperatures can greatly reduce the formation of defects that degrade the mechanical strength of the fiber.

This two-layer interphase coating, or more layers, can have added properties. For instance, the first layer can be used to provide slippage and/or it can be used to promote adhesion of the second layer. The second layer protects both the first layer and the fiber from attack from oxygen, nitrogen, and water vapor in the environment outside the fiber.

For high temperature, high mechanical loading applications, it may be beneficial to allow the fibers to slip a little within the matrix material that contains them. While this is useful when the fibers are embedded in a matrix of SiC, it can also be beneficial when the fibers are embedded in a glass-ceramic matrix according to some aspects of the current invention. The Young's modulus of the glass-ceramic matrix is almost as large as the Young's modulus of the SiC fibers. In these aspects, a coating of carbon or BN can provide the fibers with the ability to slip to equalize the stress among the many separate fibers in the composite material. Such aspects can be beneficial for the composite material when operating in a room temperature up to 1600° C. The carbon or BN "slip coatings" can be protected with a metal or metal oxide second layer to prevent them from oxidizing at operating temperatures above 800° C.

In yet another aspect, fibers made using a conventional process and consequently having oxygen concentrations above 0.1%, could have three layers of the interphase coating. For instance, a Be metal layer could be used for oxygen to diffuse to and bind with, a second layer may be provided to provide slippage and/or promote adhesion, and a third layer could be utilized to protect the fiber and the other two layers from attack from oxygen, nitrogen and water vapor in the environment outside the fiber reinforcement.

Figure 6:
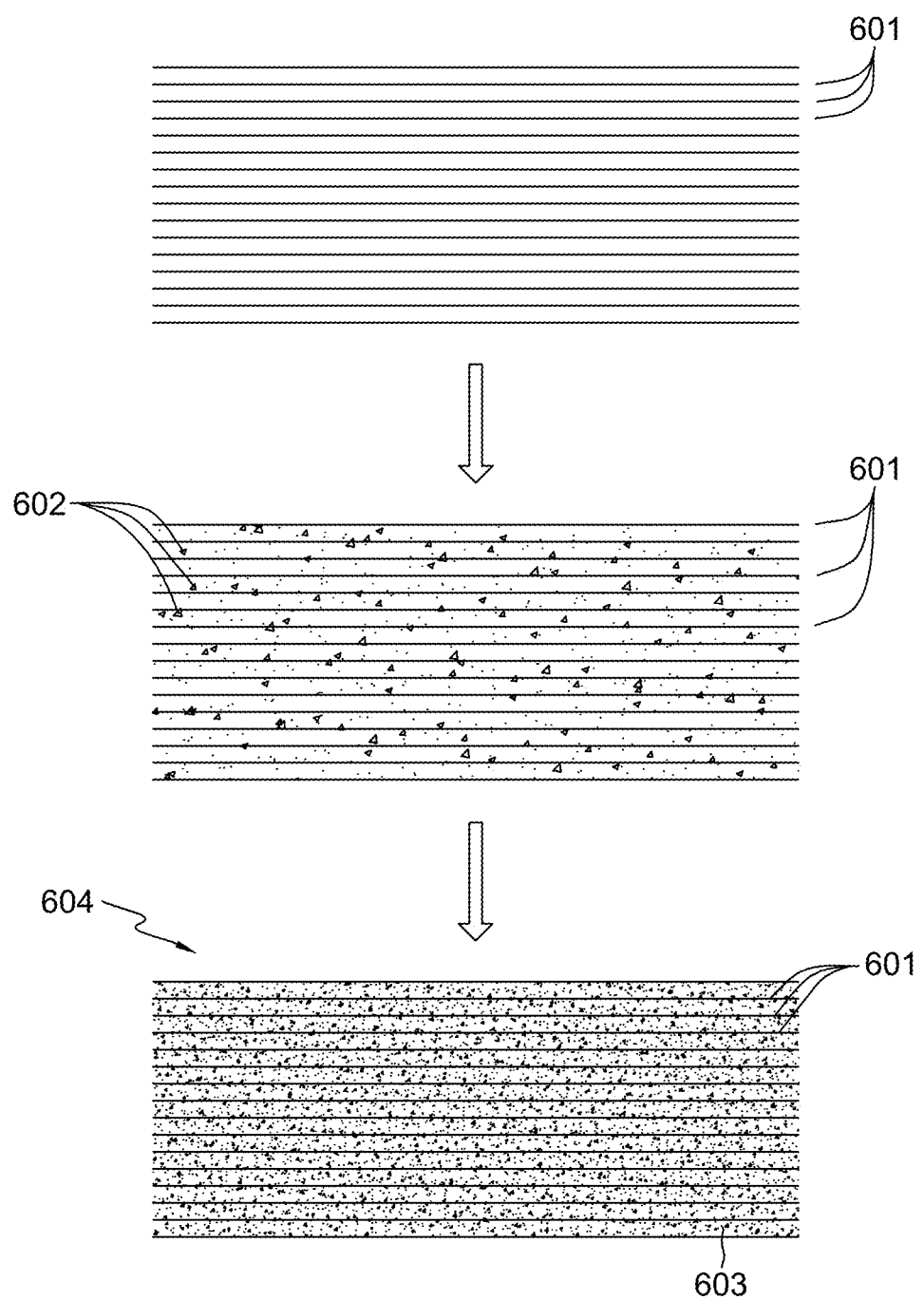
FIG. 6 depicts one embodiment of a method of forming a composite material, in accordance with one or more aspects of the present invention.

Turning to FIG. 6, in one or more embodiments, the fiber reinforcements described above may be embedded in a glass-ceramic matrix. Fibers 601 may be arranged into a shape, such as a ribbon in one aspect, and may contain several hundred fibers, the shape, in some embodiments, being caused by a shape of a press to be used for applying heat and pressure. Next, the space between the fibers is surrounded with a supply of fine particles of a glass material 602. The supply of fine particles can include a liquid-based slurry or a dry powder supply. The resulting glass-surrounded formation of fibers are then assembled to construct sheets, tubes, beams or more complex shapes. The shaped, composite material is then placed into a vacuum or inert atmosphere, and heat and pressure are applied. In one example, the material is heated to above 1300° C., and pressed for between 0.25 and 20 hours. Illustrated is a sheet 603 comprising fiber reinforcements 601 embedded in a glass-ceramic matrix 603, which is formed from glass particles 602, the matrix undergoing light crystallization from the heat and pressure applied. Although illustrated as a sheet, the composite material can take any form and may contain hundreds of fibers.

For instance, components may be utilized within jet engines. Such components could be fabricated from the glass-ceramic matrix composite system, including but not limited to combustor liners, shrouds, and nozzles. These may include shapes such as cones and pipes, or more complex shapes, such as shapes which have a rectangular base with connected fins or overhang sections. These components may be utilized to convey air and fuel at high temperatures, and to protect other sections of the engine from the high operating temperature.

Figure 7:
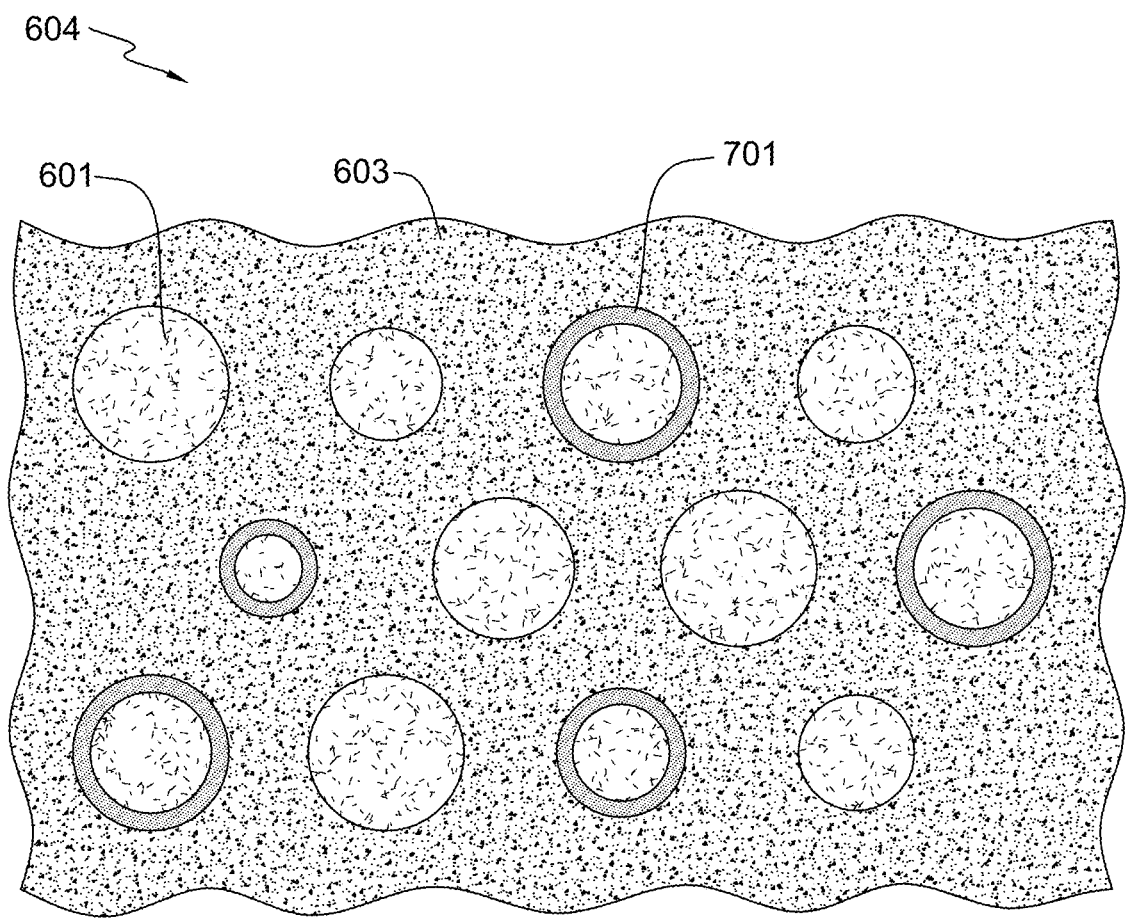
FIG. 7 is a partial cross sectional view of one embodiment of a composite material, in accordance with one or more aspects of the present invention.

FIG. 7 illustrates an embodiment of FIG. 6, in a partial cutaway view. Fiber reinforcements 601, with or without the interphase coating 701, are embedded in the glass-ceramic matrix 603. As illustrated, the fiber reinforcements, while in some embodiments may include a single diameter, can include in one or more embodiments, multiple diameters of different fiber reinforcements. Additionally, the diameter of one or more fiber reinforcements 601 may vary along the length of the fiber, in some embodiments creating a similar variation to rebar in concrete, which can increase the strength of the composite material overall. In some embodiments, the fiber reinforcements 601 can include continuous lengths of fibers, for instance, with a length of 1000 times the fiber diameter (i.e., 2.5 centimeters for a 25 micron diameter fiber), or in other embodiments, shorter lengths of less than 1000 times the fiber diameter. The fiber reinforcements can include multiple, discontinuous lengths of fibers. Additionally, in embodiments utilizing LCVD, the shape and length of the fibers can be controlled very closely, allowing for the use of tapes, tows, whiskers, and other fiber reinforcements. The ability to grow arbitrary lengths of fibers and embed them in a glass-ceramic matrix composition allows for economic and engineering flexibility in addressing different application requirements. For instance, randomly-oriented short fibers in composites have different performance characteristics than longer, oriented fiber arrays, and are produced at a lower costs, allowing for a cost-benefit analysis to choose which fiber format best suits and application's needs.

In one or more embodiments, the glass-ceramic matrix 603 may comprise a barium strontinum aluminosilicate, and the fiber reinforcement 601 may be a laser chemical vapor deposition-derived silicon carbide material. Further, the interface coating applied to the fiber (not pictured) may be, for instance, boron nitride, carbon, or beryllium oxide. As described above, multiple coatings may be included in the interface coating, to, in some examples, impart materials with different functionalities including but not limited to mechanical response to intersecting cracks, thermal conductivity, and protection from the matrix material components, as well as creep and slippage qualities. Different geometries of the interface coating may be used as well.

In one or more implementations, the composite material may include a glass-ceramic matrix that includes beryllium silicate, zirconium silicate, or other metal silicate compositions. Further, the fiber reinforcement may be a laser chemical vapor deposition-derived fiber, such as a carbide, boride, nitride or a multi-component material. By way of example, the carbide could be hafnium carbide, tantalum carbide, zirconium carbide, silicon carbide, or tungsten carbide, or combinations thereof. The boride may be hafnium diboride, tantalum diboride, zirconium diboride, titanium diboride, or tungsten diboride, or combinations thereof. The nitride may be, for instance, hafnium nitride, tantalum nitride, zirconium nitride, or titanium nitride, or combinations thereof. Further, the multi-component material may include more than two elements, including carbides, borides, nitrides and carbonitrides.

In one or more embodiments, the glass particles 602 for the matrix 603 may satisfy several parameters. One parameter includes that the glass-ceramic matrix should have a coefficient of thermal expansion (CTE) that is close to that of SiC over most of or the entire temperature range from room temperature to 1700° C. This parameter may include materials such as barium-strontium aluminosilicates, zirconium silicates, and beryllium silicates. In some aspects, other materials may be added to the glass particles 602. For instance, small amounts of other oxides may be added to tune the CTE and encourage the desired ratio of glass to ceramic after annealing.

A second parameter of the glass-ceramic material is that it is soft enough (i.e. low viscosity) in its glass phase to be hot pressed above 1300° C., allowing it to be pressed to a high fill factor with almost no voids over a period of between 0.25 and 20 hours. A high hot pressing temperature, in the range of 1700-1800° C., is possible, but degradation of the mechanical strength of the fibers should not occur during the hot pressing step.

A third parameter of the glass-ceramic material is that the glass will convert to a high percentage of a nano-crystalline ceramic phase material, with minimal or no glass phase remaining. In some embodiments, after annealing for between 0.25 and 72 more hours at a temperature at or below 1900° C., a nano-crystalline glass-ceramic matrix may be formed. This parameter can minimize the creep of the finished composite material. The nano-crystalline phase of the glass-ceramic matrix should be stable at the intended operating temperature below 1600° C., in some instances for the entire life of the material.

A fourth parameter of the glass-ceramic material is that the ceramic phase of the material should have a melting temperature above 1700° C. and a steep curve of log of viscosity versus temperature, and in some embodiments it may have a melting temperature above 2000° C. with a less steep curve of log of viscosity versus temperature.

Some materials which fit these parameters can include, but are not limited to, barium-strontium aluminosilicates, zirconium silicates, beryllium silicates and other metal silicates. As mentioned above, small amounts of other metal oxides may be added to tune the CTE, minimize creep, and control the percentage of glass phase that remains after annealing. Materials with lower melting temperatures, like barium-strontium aluminosilicates, can be lower cost than other materials. However, depending on added impurities, these lower temperature materials may have a higher creep when operated in the temperature range below 1600° C.

In one or more embodiments, the fiber reinforcements can include small amounts of secondary additives, such as beryllium, hafnium carbide, hafnium diboride, tantalum carbide, tantalum diboride, zirconium carbide, zirconium diboride, and similar refractory compositions, to improve the mechanical and thermal properties of the fiber at high temperatures. The glass-ceramic matrix composition can also include small amounts of one or more materials such as metal oxides, borides, or carbides, that enhance secondary properties such as such as fracture toughness, creep under load, thermal expansion coefficient, thermal conductivity, heat capacity, electrical and magnetic susceptibility coefficients, wavelength-specific transmission or absorption coefficients, stability in high neutron flux, and neutron cross-section. In one or more embodiments, zirconium carbide can increase oxidation resistance, beryllium can enhance the thermal conductivity and oxidation resistance, and boron can alter the desired neutron absorption cross-section.

In additional embodiments, the fibers can be made solely of other refractory materials capable of good mechanical strength at operating temperatures below 1600° C., as well as ultra-high temperature (UHT) applications with operating conditions below 2400° C. in which thermal stability of the fiber is most critical. These UHT fibers are based on carbide (zirconium carbide, hafnium carbide, tantalum carbide, boron carbide) and diboride (zirconium diboride, hafnium diboride, tantalum diboride) compositions. The method of producing these UHT fibers would be the laser-driven chemical vapor deposition process, in part to ensure control of the oxygen and nitrogen impurities to be below 0.1% which is essential to obtain good mechanical properties at operating temperatures below 1600° C. and thermal properties at operating temperatures below 2400° C. Controlling the stoichiometry closely results in good mechanical properties at and below 1600° C. operation and for high temperature stability at or below 2400° C. operation.

Some examples of composite materials formed according to one or more embodiments are given below. These examples are not meant to be limiting.

EXAMPLE 1

Figure 8:
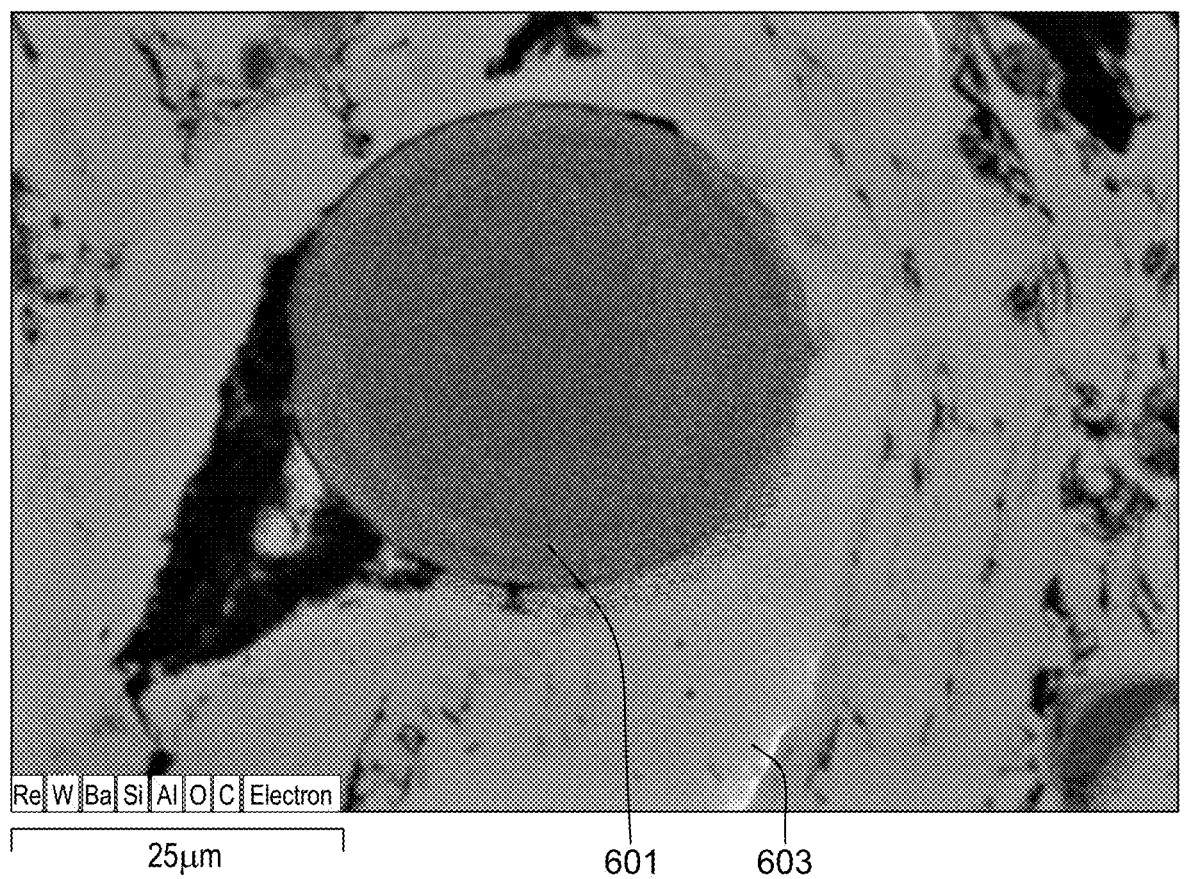
FIG. 8 is a partial graphic depiction of an energy dispersive X-ray spectroscopy image of a composite material with a fiber reinforcement within a glass-ceramic matrix, in accordance with one or more aspects of the present invention.

A Barium Strontium Aluminosilicate Matrix with LCVD formed SiC fiber reinforcements composite material was formed in an argon gas environment. The temperature was ramped up to 1500° C. from room temperature in less than 6 hours. The temperature was held for half an hour. Three tons (6,000 pounds) of pressure were applied at 1100° C. until the end of the temperature hold. Pressure and temperature controls were shut off following the hold. Light crystallization occurred due to the slow ramp down to room temperature as evidenced in scanning electron microscope images of the composite material. FIG. 8 illustrates an energy dispersive x-ray spectroscopy image of the fiber-matrix interface, showing that the fiber successfully survived the high temperature processing required for the fabrication of the glass-ceramic matrix of the composite material. As shown in FIG. 8, there is no indication of a chemical reaction or interaction between the fiber reinforcement and the matrix. Additionally, no evidence of fiber breakdown or decomposition is present, showing that there is little or no loss of fiber morphology, nor any carbon monoxide or carbon dioxide bubbles in the matrix from fiber failure.

EXAMPLE 2

A Barium Magnesium Aluminosilicate Matrix with LCVD formed SiC fiber reinforcements composite material was formed in an argon gas environment. The temperature was ramped up to 1500° C. from room temperature in less than 5 hours. The temperature was held for fifteen minutes. Two tons (4,000 pounds) of pressure were applied at 1300° C. until the end of the temperature hold. Ceramization of the BMAS glass to a crystalline phase was accomplished with a 1200° C. hold for 24 hours. Electron microscope images showed, similar to FIG. 8, that the fiber reinforcements maintained structural integrity and little or no interaction with the matrix.

Figure 9:
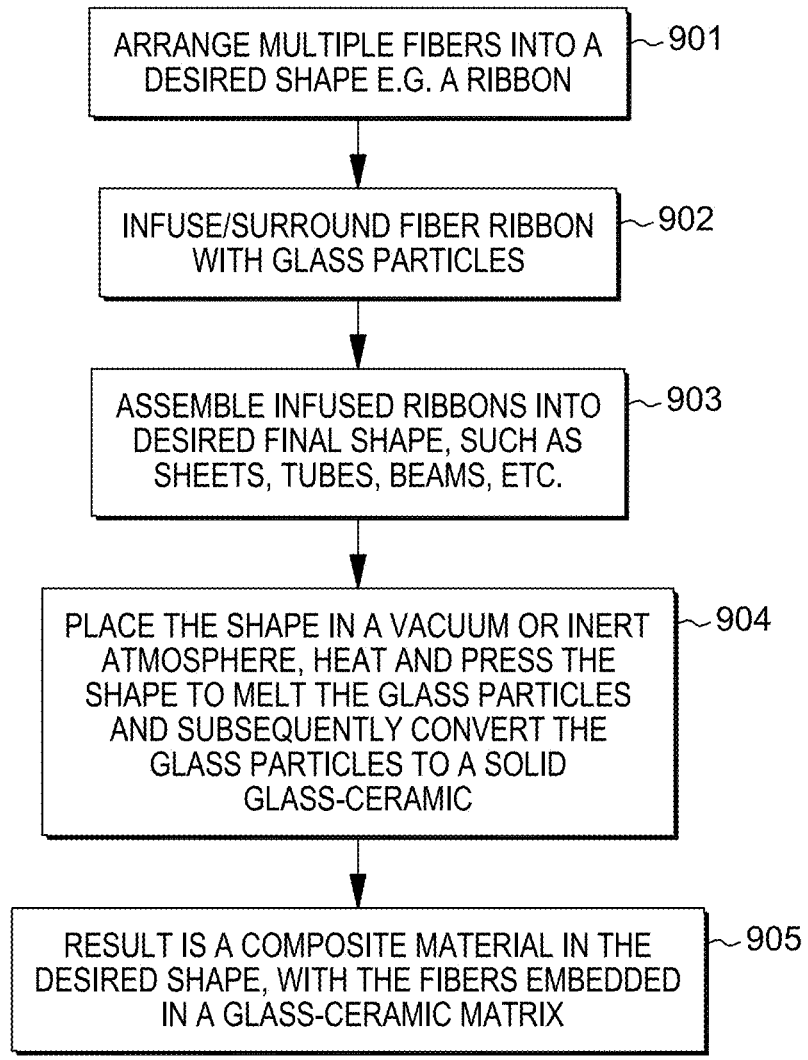
FIG. 9 depicts one embodiment of a method of forming a composite material, in accordance with one or more aspects of the present invention.

Turning to FIG. 9, in one or more embodiments, a method of forming the composite material of the above descriptions is disclosed. At 901, multiple fiber reinforcements are arranged into the desired shape, including but not limited to a ribbon. At 902, glass particles are placed surrounding the fiber reinforcements, or between the fiber reinforcements, in a hot press, for instance. At 903, the fiber reinforcements and glass particles, which can include other materials with the glass particles as described above, can be further assembled into a desired final shape, such as a sheet, tube, beam, or other shape. At 904, the assembled shape is placed in a vacuum or an inert atmosphere, where it is heated and placed under pressure, in some embodiments the pressure is applied at a particular temperature, in order to melt the glass particles. As the glass particles cool they are converted into a solid glass-ceramic matrix. In other embodiments, a ceramization process under heat is carried out to form the matrix. At 905, a composite material is provided in the shape formed, with fibers embedded within the glass-ceramic matrix.

FIG. 10 shows a method of processing conventional fibers for use in the above method. For instance, the above method may be carried out on conventionally produced SiC fibers which can have more than 0.1% oxygen and/or nitrogen, provided in 1001. At 1002, the fibers are coated with beryllium metal or another metal capable of forming a protective oxide layer and/or nitride layer. At 1003, the coated fibers are heat treated at a temperature above 1000° C. for 2 to 10 hours in an inert atmosphere. This heat treatment can allow for the oxygen and/or nitrogen to diffuse out of the SiC fibers and combine with the beryllium metal to form beryllium oxide, beryllium nitride, or a similar metal oxide/nitride, in a protective coating around the fibers, forming the interphase coating or part of the interphase coating described above. When some or all of the excess oxygen and/or nitrogen contained within the fiber has diffused out to the beryllium coating and formed BeO or beryllium nitride, the fiber can be embedded as described in reference to FIG. 9 and the above embodiments. The exact time and temperature for heat treating depends on the diameter of the fiber, with more time or higher temperatures required for larger diameter fibers. At 1004, the fiber is used in the process of FIG. 9 to form a composite material, embedding the fiber in a glass-ceramic matrix according to one or more of the embodiments described above.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:
1. A composite material comprising:
 a glass-ceramic matrix composition that is partially crystalized;
 a fiber reinforcement within the glass-ceramic matrix composition, wherein the fiber reinforcement remains stable at a temperature greater than 1400° C., the fiber reinforcement being a laser chemical vapor deposition-based fiber reinforcement; and
 an interphase coating formed on the fiber reinforcement to enhance composite material durability, the interphase coating comprising, at least in part, a slip coating to allow for slippage of the fiber reinforcement relative to the partially crystallized glass-ceramic matrix composition, and the interphase coating comprising, at least in part, a metal or metal oxide layer to protect the fiber reinforcement and the slip coating.

2. The composite material of claim 1, wherein the glass-ceramic matrix composition comprises barium strontinum aluminosilicate.

3. The composite material of claim 1, wherein the fiber reinforcement is a silicon carbide material.

4. The composite material of claim 1, wherein the interphase coating on the fiber reinforcement comprises one of boron nitride, carbon, or beryllium oxide.

5. The composite material of claim 1, wherein the glass-ceramic matrix composition remains stable at an operating temperature greater than 1400° C.

6. The composite material of claim 1, wherein the glass-ceramic matrix composition comprises one of beryllium silicate, zirconium silicate, or other metal silicate composition.

7. The composite material of claim 6, wherein the fiber reinforcement comprises a refractory fiber derived by laser chemical vapor deposition, the refractory fiber comprising one of a carbide, a boride, a nitride, or a multi-component material comprising two or more elements.

8. The composite material of claim 7, wherein the refractory fiber comprises the carbide, and the carbide is selected from a group consisting of: hafnium carbide, tantalum carbide, zirconium carbide, silicon carbide, or tungsten carbide, or combinations thereof.

9. The composite material of claim 7, wherein the refractory fiber comprises the boride, and the boride is selected from a group consisting of: hafnium boride, tantalum boride, zirconium boride, titanium diboride, or tungsten boride, or combinations thereof.

10. The composite material of claim 7, wherein the refractory fiber comprises the nitride, and the nitride is selected from a group consisting of: hafnium nitride, tantalum nitride, zirconium nitride, titanium nitride, or tungsten nitride, or combinations thereof.

11. The composite material of claim 7, wherein the refractory fiber comprises the multi-component material, the multi-component material comprising more than two elements.

12. The composite material of claim 11, wherein the multi-component material is selected from a group consisting of: carbides, borides, nitrides and carbonitrides.

13. The composite material of claim 1, wherein the metal or metal oxide layer comprises silicon carbide, beryllium, beryllium oxide, zirconium oxide, or titanium oxide.

14. A composite material comprising:
a glass-ceramic matrix composition stable at operating temperatures greater than 1400° C., the glass-ceramic matrix composition being partially crystallized;
a fiber reinforcement, derived by laser chemical vapor deposition, that remains stable at operating temperatures greater than 1400° C. within the glass-ceramic matrix composition; and
an interphase coating formed on the fiber reinforcement to enhance the composite material rigidity, the interphase coating comprising, at least in part, a slip coating to allow for slippage of the fiber reinforcement relative to the partially crystallized glass-ceramic matrix composition, and the interphase coating comprising, at least in part, a metal or metal oxide layer to protect the fiber reinforcement and the slip coating.

15. The composite material of claim 14, wherein:
the glass-ceramic matrix composition is composed of barium strontinum aluminosilicate;
the fiber reinforcement is a laser chemical vapor deposition-derived silicon carbide material; and
the interphase coating applied to the fiber, formed using a laser chemical vapor deposition process and selected from a group consisting of: boron nitride, carbon, and beryllium oxide.

16. The composite material of claim 14, wherein:
the glass-ceramic matrix composition is composed of beryllium silicate, zirconium silicate, or other metal silicate compositions; and
the fiber reinforcement is a laser chemical vapor deposition-derived refractory fiber selected from a group consisting of:
a carbide, consisting of hafnium carbide, tantalum carbide, zirconium carbide, silicon carbide, or tungsten carbide, or combinations thereof;
a boride, consisting of hafnium diboride, tantalum diboride, zirconium diboride, titanium diboride, or tungsten diboride, or combinations thereof;
a nitride, consisting of hafnium nitride, tantalum nitride, zirconium nitride, or titanium nitride, or combinations thereof; and
a multi-component material which is comprised of more than two different materials, one of the materials including at least one from a group comprising: carbides, borides, nitrides, and carbonitrides.

17. The composite material of claim 14, wherein the metal or metal oxide layer comprises silicon carbide, beryllium, beryllium oxide, zirconium oxide, or titanium oxide.

18. A method of forming a composite material comprising:
obtaining a plurality of fiber reinforcements, a fiber reinforcement of the plurality of fiber reinforcements remaining stable at an operating temperature greater than 1400° C., and an interphase coating formed thereon, the interphase coating comprising, at least in part, a slip coating, and the interphase coating comprising, at least in part, a metal or metal oxide layer to protect the fiber reinforcement and the slip coating;
assembling the plurality of fiber reinforcements into a press;
surrounding the plurality of fiber reinforcements with glass particles;
applying heat and pressure to the plurality of fiber reinforcements surrounded by glass particles in the press under one of a vacuum or an inert atmosphere, melting the glass particles and forming a glass-ceramic matrix composition surrounding the plurality of fiber reinforcements, the glass-ceramic matrix composition being partially crystallized; and
wherein the slip coating formed on a fiber reinforcement of the plurality of fiber reinforcements allows for slippage of the fiber reinforcement relative to the partially crystallized glass-ceramic matrix composition to enhance composite material durability.

19. The method of claim 18, wherein the press produces a shaped product comprising one of a ribbon, a sheet, a tube, and a beam.

20. The method of claim 18, wherein the glass particles comprise one of barium strontium, aluminosilicate, beryllium silicate, zirconium silicate, or other metal silicate composition.

21. The method of claim 18, wherein the fiber reinforcement is a silicon carbide material produced by laser chemical vapor deposition.

22. The method of claim 18, wherein the interphase coating formed on the fiber reinforcement formed using a laser chemical vapor deposition process and comprises one of boron nitride, carbon, or beryllium oxide.

23. The method of claim 18, wherein the metal or metal oxide layer comprises silicon carbide, beryllium, beryllium oxide, zirconium oxide, or titanium oxide.

\* \* \* \* \*